United States Patent
Hiyama

(10) Patent No.: US 8,582,309 B2
(45) Date of Patent: Nov. 12, 2013

(54) PANEL FIXING STRUCTURE AND INFORMATION PROCESSOR

(75) Inventor: Kenichi Hiyama, Sagamihara (JP)

(73) Assignee: Ricoh Company, Ltd., Tokyo (JP)

( * ) Notice: Subject to any disclaimer, the term of this patent is extended or adjusted under 35 U.S.C. 154(b) by 7 days.

(21) Appl. No.: 13/161,629

(22) Filed: Jun. 16, 2011

(65) Prior Publication Data

US 2011/0310554 A1 Dec. 22, 2011

(30) Foreign Application Priority Data

Jun. 17, 2010 (JP) ................................. 2010-137840

(51) Int. Cl.
*H05K 7/00* (2006.01)

(52) U.S. Cl.
USPC ......................................................... 361/747

(58) Field of Classification Search
USPC .................................................. 361/651, 644
See application file for complete search history.

(56) References Cited

U.S. PATENT DOCUMENTS

| | | | | |
|---|---|---|---|---|
| 3,432,129 A | * | 3/1969 | Santucci | 248/69 |
| 4,457,482 A | * | 7/1984 | Kitagawa | 248/74.3 |
| 5,191,514 A | * | 3/1993 | Kabat et al. | 361/802 |
| 5,191,544 A | | 3/1993 | Benck et al. | |
| 5,313,370 A | * | 5/1994 | Schwenk et al. | 361/802 |
| 5,568,868 A | * | 10/1996 | Keller et al. | 206/724 |
| 5,658,156 A | * | 8/1997 | Henderson et al. | 439/79 |
| 5,757,617 A | * | 5/1998 | Sherry | 361/730 |
| 5,815,379 A | * | 9/1998 | Mundt | 361/679.55 |
| 6,034,874 A | * | 3/2000 | Watanabe | 361/704 |
| 6,157,540 A | * | 12/2000 | Eddings et al. | 361/727 |
| 6,189,938 B1 | * | 2/2001 | Nakadaira et al. | 292/87 |
| 6,227,632 B1 | * | 5/2001 | Liu | 312/223.2 |
| 6,272,722 B1 | * | 8/2001 | Lai | 24/458 |
| 6,487,079 B2 | * | 11/2002 | Katsui | 361/704 |
| 6,724,637 B2 | * | 4/2004 | Li et al. | 361/760 |
| 6,780,043 B2 | * | 8/2004 | Malmberg | 439/377 |
| 6,850,413 B2 | * | 2/2005 | Amie et al. | 361/737 |
| 6,864,573 B2 | * | 3/2005 | Robertson et al. | 257/718 |
| 6,954,354 B2 | * | 10/2005 | Shyr | 361/679.33 |
| 7,391,619 B1 | * | 6/2008 | Lee | 361/759 |
| 7,489,514 B2 | * | 2/2009 | Hamasaki et al. | 361/721 |
| 7,561,441 B1 | * | 7/2009 | Chang | 361/801 |
| 8,218,336 B2 | * | 7/2012 | Schnuerer et al. | 361/807 |
| 2007/0274057 A1 | * | 11/2007 | Fukumoto | 361/807 |
| 2009/0057506 A1 | * | 3/2009 | Yin | 248/200 |
| 2009/0141468 A1 | * | 6/2009 | Yang | 361/807 |
| 2011/0090637 A1 | | 4/2011 | Hiyama | |

FOREIGN PATENT DOCUMENTS

JP 4-233017 8/1992

\* cited by examiner

*Primary Examiner* — Hoa C Nguyen
*Assistant Examiner* — Xanthia C Cunningham
(74) *Attorney, Agent, or Firm* — Cooper & Dunham LLP

(57) ABSTRACT

A panel fixing structure, which removably fixes a panel to a square opening provided in a housing, so as to cover a circumference of one or a plurality of interface terminal portions provided inside the housing, includes a square panel surface having a terminal opening in accordance with a shape and a position of the interface terminal portion and four engagement protrusions each having a spring property, each of the four engagement protrusions protruding in an insertion direction of the opening along an edge portion of each of four sides of the panel surface, the engagement protrusions being formed to have a space in each of four corner portions of the panel surface.

6 Claims, 18 Drawing Sheets

PANEL FIXING STRUCTURE AND INFORMATION PROCESSOR

PRIORITY CLAIM

The present application is based on and claims priority from Japanese Patent Application No. 2010-137840, filed on Jun. 17, 2010, the disclosure of which is hereby incorporated by reference in its entirety.

BACKGROUND

1. Field of the Invention

The present invention relates to a panel fixing structure which removably fixes a panel to a rectangular panel fixing opening provided in a housing, so as to cover the circumference of one or a plurality of interface terminals disposed inside the housing, and an information processor in which a panel is fixed by the panel fixing structure.

2. Description of the Related Art

Input and output (I/O) connectors to which external devices or the like are electrically connected are provided in a panel fixing opening formed on the back surface or the like of a housing as an external casing of a personal computer (hereinafter, referred to as a personal computer). A panel which electrically shields the input and output connectors is removably fixed to the panel fixing opening, so as to cover the circumference of the input and output connectors.

As a fixing structure which removably fixes a panel to a panel fixing opening, a panel fixing structure described in Paragraph [0022] and FIG. 4 of Japanese Patent Application Publication No. H04-233017 (Reference 1) is known. According to the panel fixing structure described in Reference 1, a plurality of projections (dependent legs in Reference 1) provided in the long side of the lower side of the square panel (shield member in Reference 1) fits the neighborhood of the edge portion of the lower surface of the panel fixing opening (bay opening in Reference 1). Then, a pair of engagement projections (spring tags in Reference 1) having a spring property, which is provided in both of the short sides of the square panel (shield member in Reference 1), is pressed into the edge portions of the panel fixing opening on both sides to be engaged therewith while bending.

In the panel fixing structure described in Reference 1, as described above, both the operation which fits the projections provided in the long side of the lower side of the square panel to the neighborhood of the edge portion of the lower surface of the panel fixing opening, and the operation, which engages a pair of the engagement projections having a spring property, which is provided in both of the short sides of the square panel, with both of the edge portions of the panel fixing opening while bending the engagement projections, are required. For this reason, the workability when fixing the panel to the panel fixing opening is inefficient.

Therefore, in order to improve the workability of panel fixing, a panel fixing structure using a panel 100 having a panel surface 100a as illustrated in FIG. 19 is known. The panel 100 includes engagement protrusions 100b, 100c formed in the edge portions of the four sides of the panel surface 100a along the longitudinal direction (in FIG. 19, the neighborhood of the edge portions of the adjacent long and short sides is illustrated). Each of the engagement protrusions 100b, 100c protrudes in the insertion direction to the panel fixing opening and has a spring property. The leading end portion of each of the engagement protrusions is bent outwardly at about 180 degrees. In addition, a plurality of semispherical projections 100d is provided in the external surface of each engagement protrusion 100b, 100c along the longitudinal direction. The leading end portion of each engagement protrusion 100b, 100c on the projection side 100d is bent outwardly, and includes a leading end locking portion 100e.

As illustrated in FIGS. 20A, 20B, by inserting each engagement protrusion 100b, 100c of the panel plate 100 into the panel fixing opening 101, the projections 100d make contact with the inside wall surface of the panel fixing opening 101, and each engagement protrusion 100b, 100c reaches the edge portion of the inside wall surface while bending in the inside direction of the panel fixing opening 101, so that each bent engagement protrusion 100b, 100c is brought back to the original condition. The panel 100 is thereby fixed to the panel fixing opening 101 while sandwiching the panel fixing opening 101 by way of the leading end locking portions 100e and the projections 100d which are locked to the neighborhood of the edge portion of the inside wall surface opposite the insertion direction from both surfaces as illustrated in FIG. 20B.

Meanwhile, a space having a predetermined width is provided between the corner portions of the engagement protrusions 100b, 100c on the adjacent long side and short side, such that the engagement protrusions 100b, 100c do not interfere (make contact) with each other when each engagement protrusion 100b, 100c is inserted into the panel fixing opening 101 to be engaged therewith while bending.

Each of FIGS. 19, 20A, 20B schematically illustrates the shape of the space provided between the corner portions of the adjacent engagement protrusions 100b, 100c. Specifically, as illustrated in FIG. 21A, a cutting process is performed on the end portions of the adjacent engagement protrusions 100b, 100c, such that leading end corner portions 100f, 100g which are engaged with the corner portions of the inside wall surface of the panel fixing opening 101 when inserting are previously formed in a predetermined shape to be symmetric with the same length with respect to the intermediate line A in the middle of the corner portions.

If the size of the panel fixing opening 101 to which the panel 100 is fixed is small, the size of the entire panel 100 is adjusted according to the size of the panel fixing opening 101, so that the space between the leading end corner portions 100f, 100g of the adjacent engagement protrusions 100b, 100c illustrated in FIG. 21A is reduced according to the size of the panel 100.

For this reason, as illustrated in FIG. 21B, the leading end corners of the leading end corner portions 100f, 100g may interfere with each other by the variations in the measurement of the space between the adjacent leading end corner portions 100f, 100g in manufacturing. If the corners of the bent leading end corner portions 100f, 100g interfere with each other, the contact condition of the leading end corner portions 100f, 100g becomes unstable, so that it may become difficult to insert the engagement protrusions 100b, 100c into the panel fixing opening 101.

If some kind of external force acts on the engagement protrusions 100b, 100c of the panel 100 from the direction opposite the insertion direction in a state in which the panel 100 is fixed to the panel fixing opening 101, the engagement protrusions 100b, 100c easily bend in the inside direction of the panel fixing opening 101. Accordingly, if the engagement protrusions 100b, 100c bend by the external force, the locked state of the semispherical projections 100d which are locked to the neighborhood of the edge portion of the panel fixing opening 101 is easily released. The panel 100 may be thereby removed from the panel fixing opening 101.

SUMMARY

It is, therefore, an object of the present invention to provide a panel fixing structure which prevents an unstable contact condition by the interference of the corner portions of the leading end corner portions of the adjacent engagement protrusions if each of the engagement protrusions of the panel plate is inserted into the panel fixing opening while bending to be engaged therewith.

In order to achieve the above object, one embodiment of the present invention provides a panel fixing structure, which removably fixes a panel to a rectangular opening provided in a housing, so as to cover a circumference of one or a plurality of interface terminal portions provided inside the housing, the panel, comprising: a rectangular panel surface having a terminal opening in accordance with a shape and a position of the interface terminal portion; and four engagement protrusions each having a spring property, each of the four engagement protrusions protruding in an insertion direction of the opening along an edge portion of each of four sides of the panel surface, the engagement protrusions being formed to have a space in each of four corner portions of the panel surface, each of the four engagement protrusions having a first wall portion which extends from each of the four edge portions of the panel surface in the insertion direction of the opening, a second wall portion in which a leading end portion of the first wall portion is bent outside and which extends in the direction opposite the insertion direction of the panel fixing opening, and a plurality of projections provided in an outer surface of the second wall portion along the longitudinal direction of the second wall portion, wherein if each of the engagement protrusions of the panel is inserted into the opening, the projections make contact with the inside wall surface of the opening, and if each of the engagement protrusions reaches an end portion opposite the insertion direction of the opening while bending in the inside direction of the opening, the bent engagement protrusion is brought back to an original condition, so that the projections are locked near the edge portion opposite the panel insertion side of the opening, and the panel is thereby fixed to the opening, and as a maximum bending amount of each engagement protrusion in the inside direction of the opening, a corner portion having a large bending amount and a corner portion having a small bending amount are set, and the corner portion having the large bending amount is set in at least one of the four corners.

BRIEF DESCRIPTION OF THE DRAWINGS

The accompanying drawings are included to provide further understanding of the invention, and are incorporated in and constitute a part of this specification. The drawings illustrate embodiments of the invention and, together with the specification, serve to explain the principle of the invention.

FIG. 4A is a view illustrating a state before inserting the I/O panel into the panel fixing opening; FIG. 4B is a view illustrating a state while inserting the I/O panel into the panel fixing opening; and FIG. 4C is a view illustrating a state after inserting the I/O panel into the panel fixing opening.

DETAILED DESCRIPTION OF THE PREFERRED EMBODIMENTS

Hereinafter, embodiments of the present invention will be described with reference to the drawings.

Embodiment 1

Figure 1:
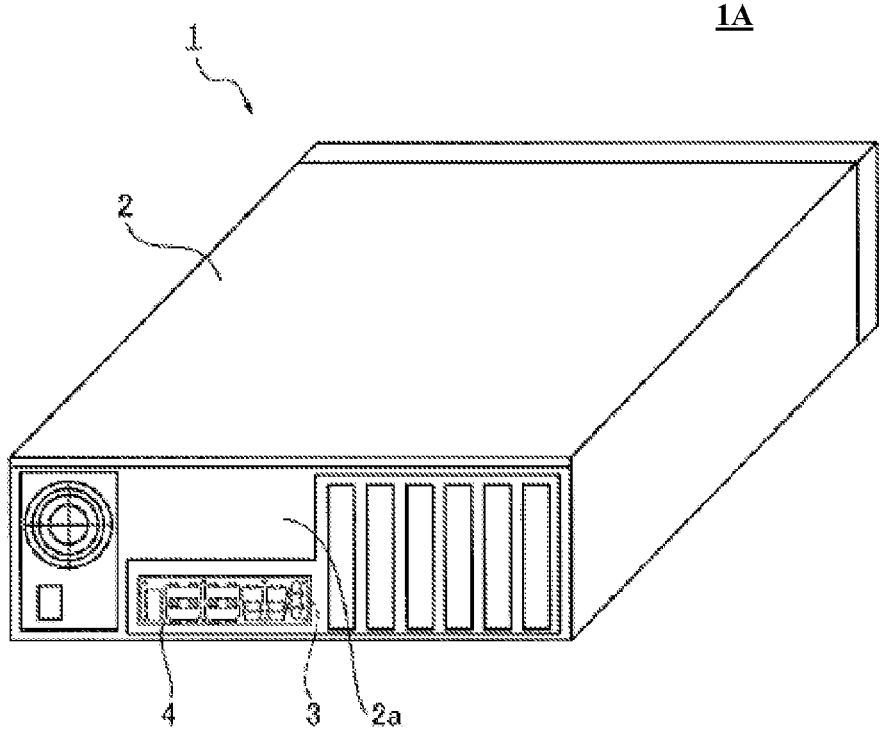
FIG. 1 is a perspective view illustrating a back side of a personal computer body to which a panel fixing structure according to Embodiment 1 of the present invention is applied.

FIG. 1 is a perspective view illustrating a back side of a body of a personal computer as an information processor 1A to which a panel fixing structure is applied.

In the present embodiment illustrated in FIG. 1, a metal I/O panel 4 is removably fixed to a rectangular opening 3 (refer to FIG. 2A) formed in a back side plate 2a of a housing 2 of a personal computer body 1 (hereinafter, referred to as a personal computer housing), so as to be engaged near the edge portion of the opening 3 (the fixing structure of the I/O panel 4 to the opening 3 will be described later).

Figure 2A:
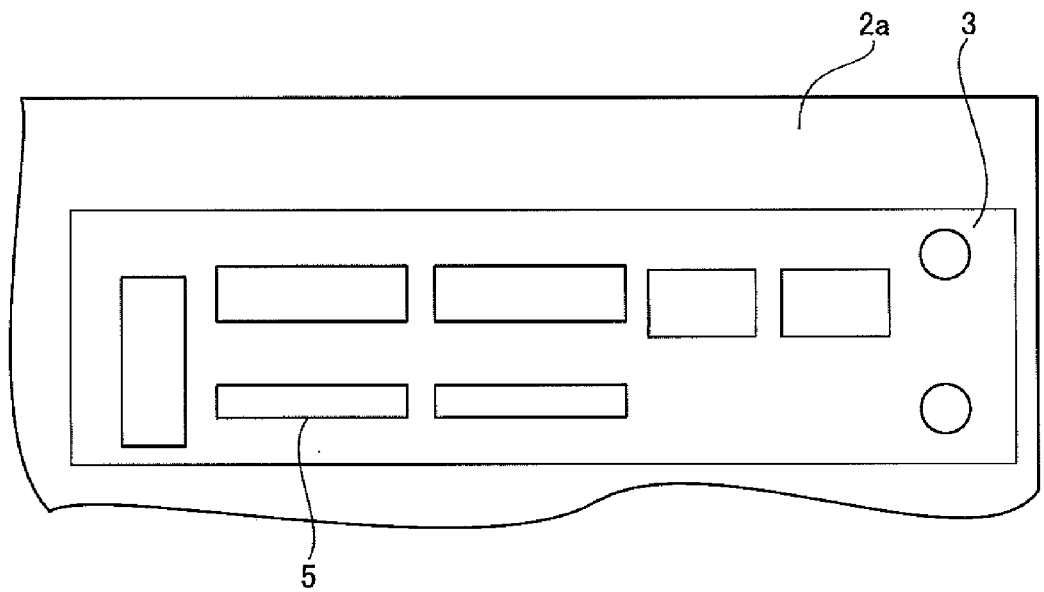
FIG. 2A is a view illustrating a panel fixing opening to which an I/O panel is fixed.

As illustrated in FIG. 2A, a plurality of input and output (I/O) connectors (that is, interface terminal portions) 5 to which a not illustrated external device or the like and a not illustrated circuit board in the personal computer housing 2 are electrically connected is located in the back side of the rectangular opening 3. The I/O panel 4 is fixed to the opening 3 to cover the circumference of each of the input and output connectors (interface terminal portions) 5, in order to electrically shield the input and output connectors 5.

Figure 2B:
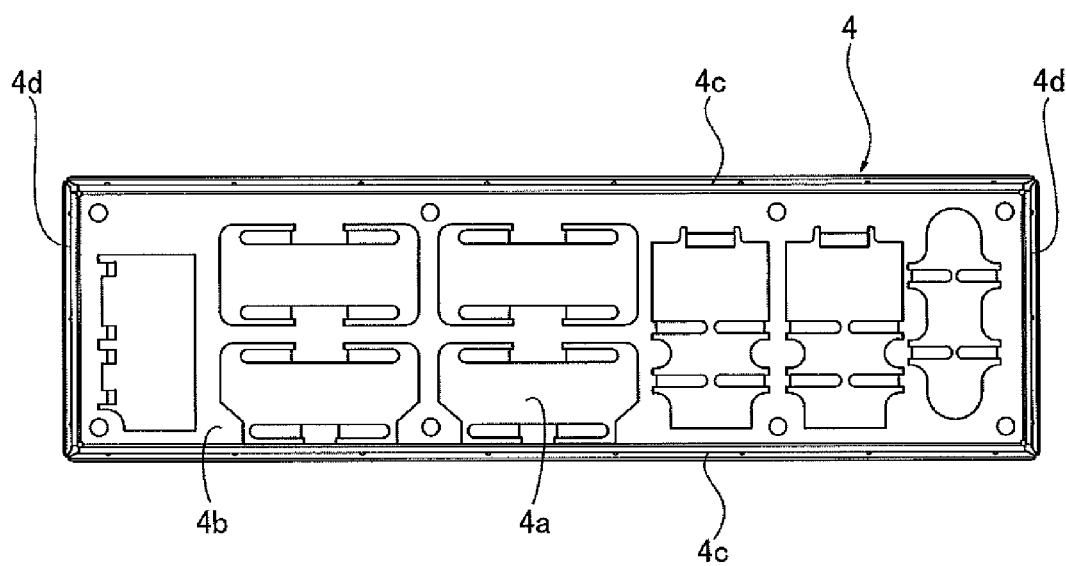
FIG. 2B is a view illustrating the I/O panel which is fixed to the panel fixing opening.

As illustrated in FIG. 2B, the I/O panel 4 includes a panel surface 4b having a plurality of connector openings (that is, terminal opening) 4a in accordance with the shapes and the positions of the input and output connectors 5 and a pair of engagement protrusions 4d on the short side of the panel surface 4b and a pair of engagement protrusions 4c on the long side of the panel surface 4b. Each of the engagement protrusions 4c, 4d has a spring property. Each of the engagement protrusions 4c on the long side is engaged with the inside wall surface of the opening 3, and protrudes from the edge portion of the long side of the panel surface 4b in the insertion direction (the front direction to the paper in FIG. 2B). Each of the engagement protrusions 4d on the short side is engaged with the inside wall surface of the opening 3, and protrudes from the edge portion of the short side of the panel surface 4b in the insertion direction (the front direction to the paper in FIG. 2B). In addition, the panel surface 4b of the I/O panel 4 on the insertion direction side illustrated in FIG. 2B faces the outer surface side of the housing back surface 2a (the side opposite the inside of the housing 2) when the I/O panel 4 is fixed to the opening 3.

Figure 3A:
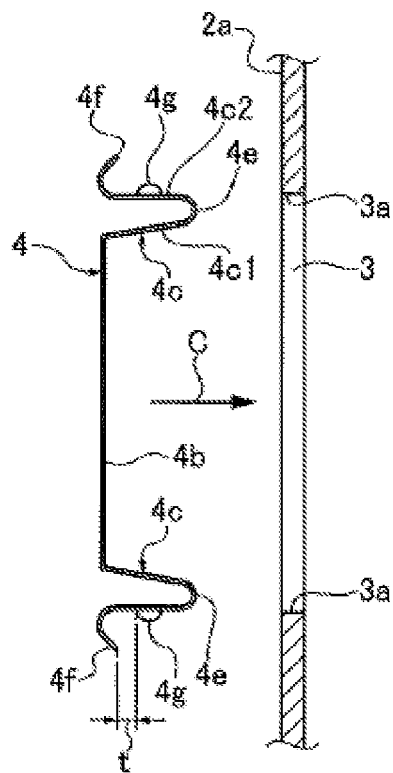
FIG. 3A is a side view illustrating the I/O panel.
Figure 3B:
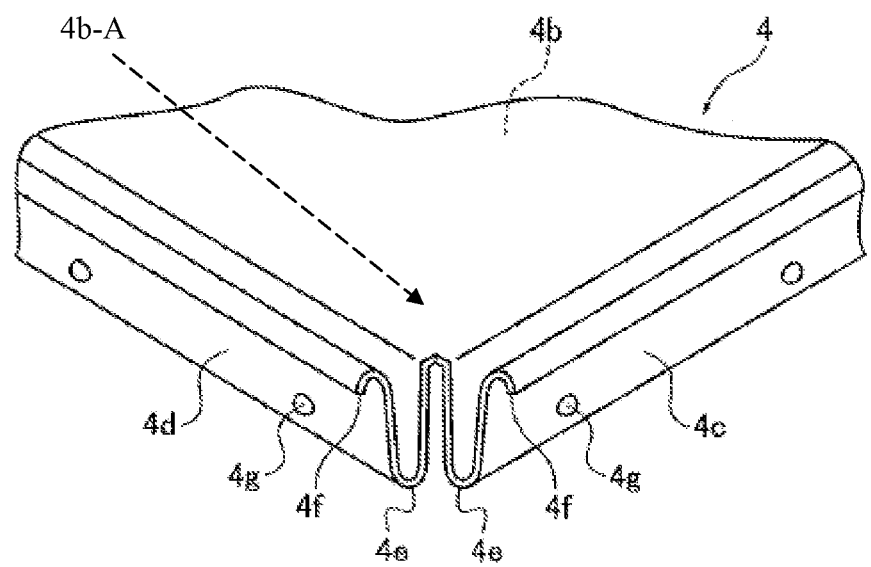
FIG. 3B is a perspective view illustrating a corner portion 4b-A of the I/O panel.

As illustrated in FIGS. 3A, 3B, each of the engagement protrusions 4c, 4d of the I/O panel 4 (in FIG. 3A, a pair of the engagement protrusions 4c on the long side is illustrated, but a pair of the engagement protrusions 4d on the short side is the same) includes a first wall portion 4c1 extending from the panel surface 4b in the insertion direction C to the opening 3, a leading end portion 4e which is provided in the leading end portion of the first wall portion 4c1 and is bent outside at about 180 degrees into an R-shape, and a second wall portion 4c2 extending in the direction opposite the insertion direction C. Each of the engagement protrusions 4c, 4d has a spring property. A leading end locking portion 4f which is bent outside to the insertion direction C is provided in the leading end portion of the second wall portion 4c2 of each of the engagement protrusions 4c 4d.

A plurality of semispherical projections 4g is provided on the surface of the second wall portion 4c2 of each engagement protrusion 4c, 4d at predetermined intervals. In addition, a connector opening of the panel surface 4b is omitted in FIG. 3B.

In a state before the leading end portion 4e is inserted into the panel fixing opening 3, the position of the leading end portion 4e of each engagement protrusion 4c, 4d substantially corresponds to the position of each inside wall surface 3a of the opening 3 and the projection 4g is located outside the inside wall surface 3a of the opening 3 by the thickness of the projection. The distance t between the leading end locking portion 4f and the projection 4g substantially corresponds to the thickness of the inside wall surface 3a of the opening 3.

Moreover, the end portions (corner portions) of the adjacent engagement protrusions 4c, 4d are cut into a predetermined shape such that a predetermined space is formed between the end portions (the details of the shapes of the end portions (corner portions) of the adjacent engagement protrusions 4c, 4d will be described later).

Next, the fixing structure of the I/O panel 4 to the opening 3 in the present embodiment will be described with reference to FIGS. 4A, 4B, 4C.

Figure 4A:
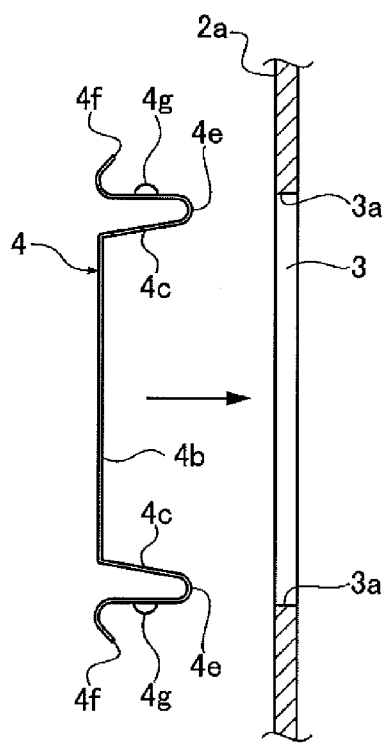
FIGS. 4A-4C illustrate a fixing structure in which the I/O panel is fixed to the panel fixing opening.
Figure 4B:
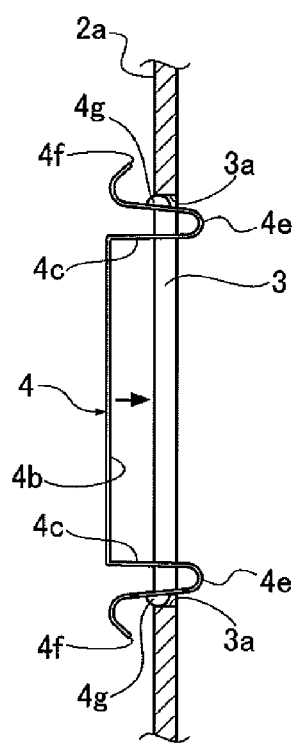

As illustrated in FIGS. 4A, 4B, if each engagement protrusion 4c having a spring property provided in each edge portion of the panel surface 4b of the I/O panel 4 is inserted into the opening 3 of the housing back surface 2a (in FIG. 4A, a pair of the engagement protrusions 4c on the long side is illustrated, but a pair of the engagement protrusions 4d on the short side is also inserted into the opening 3 similar to the engagement protrusions 4c), the semispherical projection 4g on the outer surface makes contact with the inside wall surface 3a, so that a pair of the engagement protrusions 4c bends in the inside direction of the opening 3 (in the direction separating from the inside wall surface 3a of the opening 3).

Figure 4C:
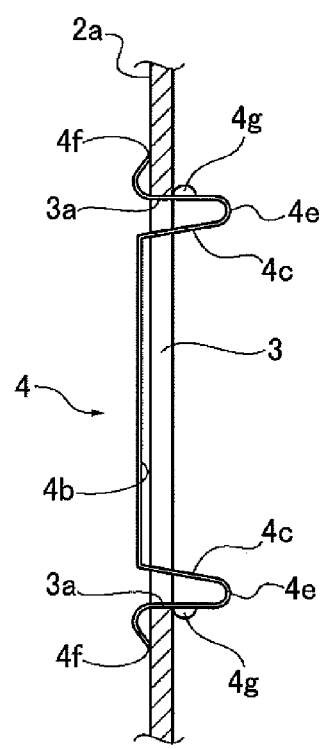

Then, as illustrated in FIG. 4C, if each of the projections 4g is inserted into the opposite edge portion of the opening 3, the bent engagement protrusion 4c is brought back to the original condition and is engaged with the inside wall surface 3a, and then the leading end locking portion 4f is locked to the housing back surface 2a. Thereby, the I/O panel 4 is fixed to the opening 3 by sandwiching both surfaces near the edge portions of the opening 3 between the leading end locking portion 4f and the projection 4g of each of the engagement protrusions 4c, 4d.

Figure 5:
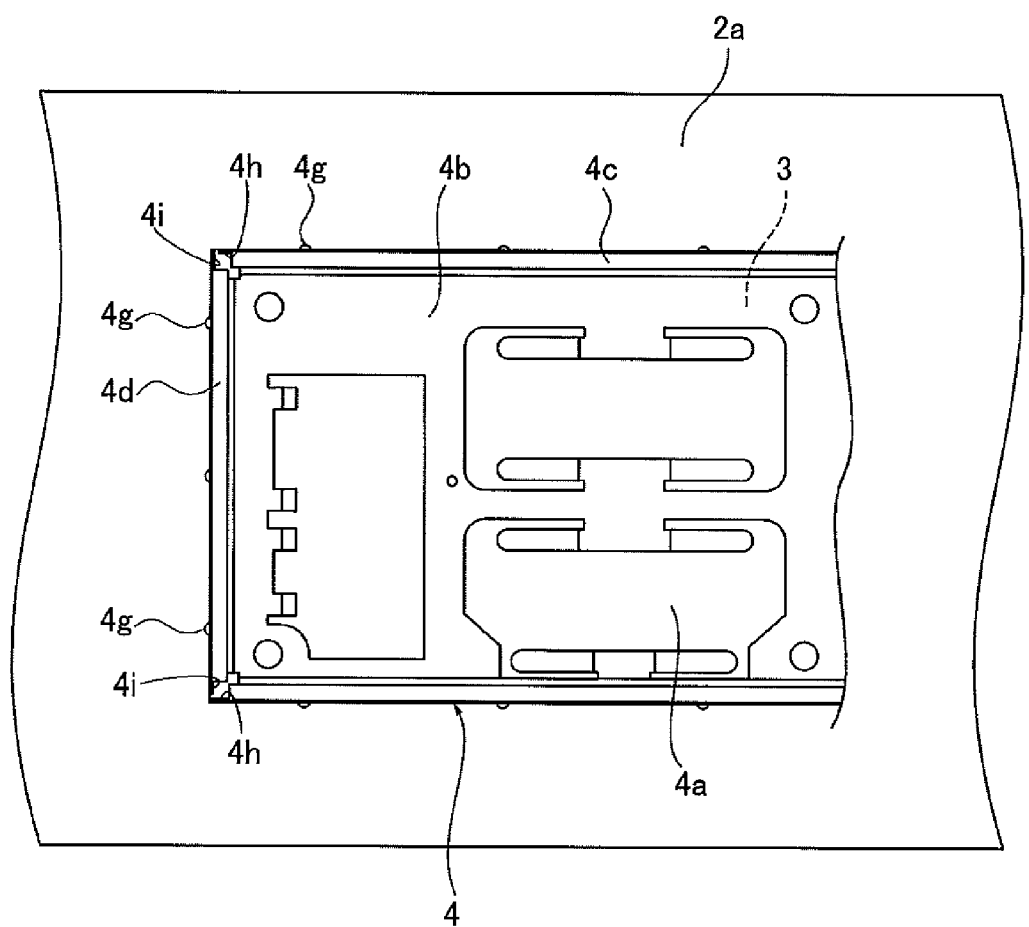
FIG. 5 is a view illustrating a state in which the I/O panel is fixed to the panel fixing opening.

FIG. 5 illustrates the external surface of the housing back surface plate 2a (on the side opposite the inside of the personal computer housing 2) in which the I/O panel 4 is fixed to the opening 3. The housing back surface plate 2a to which the I/O panel 4 is fixed is fixed to the back surface of the personal computer housing 2 by a rivet, spot welding, screwing or the like.

When removing the fixed I/O panel 4 from the opening 3, for example, each engagement protrusion 4c, 4d is bent in the inside direction of the opening 3 by the force acting in the inside direction of the opening 3, so that the engagement state with the edge portion of the inside wall surface of the projection 4g is released. Then, by pushing back each engagement protrusion 4c, 4d to the direction opposite the insertion direction, the I/O panel 4 can be removed from the opening 3.

Next, the shapes of the end portions of the adjacent engagement protrusions 4c, 4d will be described.

As illustrated in FIG. 5, when fixing the I/O panel 4 to the panel fixing opening 3 by inserting each engagement protrusion 4c, 4d into the panel fixing opening 3 while bending each of the engagement protrusions 4c, 4d, it is necessary to stably make contact with the leading end corner portion 4h, 4i of the engagement protrusions 4c, 4d such that the corners of the leading end corner portions 4h, 4i do not interfere (make contact) with each other.

Figure 6A:
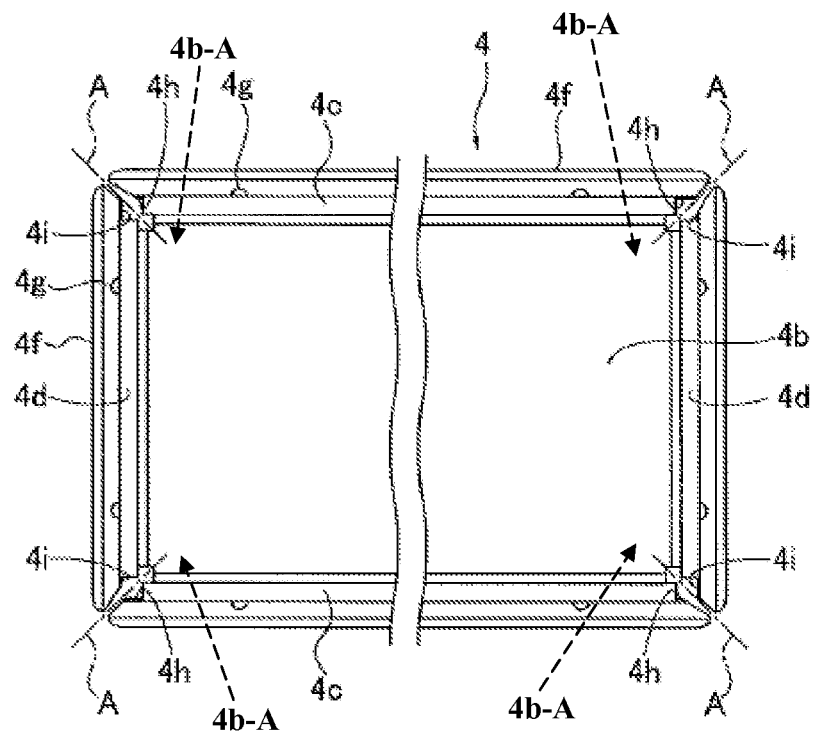
FIG. 6A is a view illustrating the corner portions 4b-A, and the neighborhood of the leading end corner portion of each engagement protrusion, of the I/O panel in Embodiment 1.
Figure 6B:
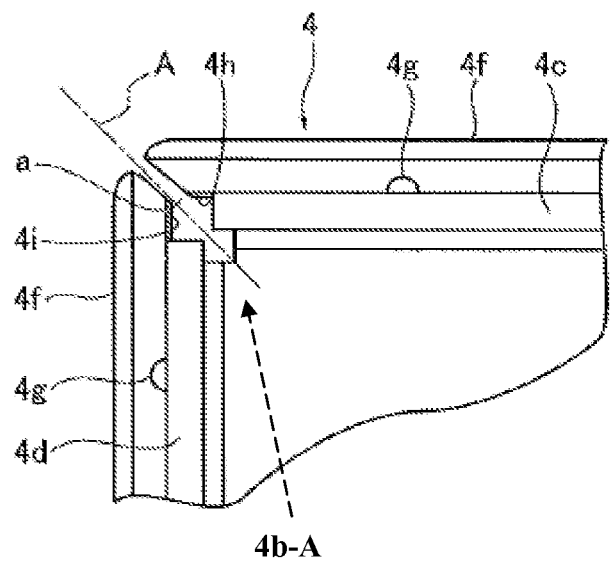
FIG. 6B is an enlarged view illustrating the corner portion 4b-A and the neighborhood of the leading end corner portion in the upper left side.

Consequently, as illustrated in FIGS. 6A, 6B, in the present embodiment, one leading end corner portion 4h, 4i of the adjacent engagement protrusions 4c, 4d is set shorter than the other leading end corner portion 4h, 4i of the adjacent engagement protrusions 4c, 4d in the four corner portions of the I/O panel 4, so that the maximum bending amount of the end portions of the engagement protrusions 4c, 4d is set to be different relative to the intermediate line A in the middle of the corner portions. More specifically, as illustrated in FIG. 6A, in the upper left corner portion and the lower right corner portion, the leading end corner portion 4h of the engagement protrusion 4c is set shorter than the leading end corner portion 4i of the engagement protrusion 4d such that the leading end corner portions 4h, 4i become asymmetric to the intermediate line A in the middle of the corner portions, and in the lower left corner portion and the upper right corner portion, the leading end corner portion 4i of the engagement protrusion 4d is set shorter than the leading end corner portion 4h of the engagement protrusion 4c such that the leading end corner portions 4h, 4i become asymmetric to the intermediate line A in the middle of the corner portions.

In addition, FIG. 6B illustrates the leading end corner portions 4h, 4i of the adjacent engagement protrusions 4c, 4d in the upper left corner portion. In FIG. 6A, the connector opening of the panel surface 4b is omitted.

Figure 7:
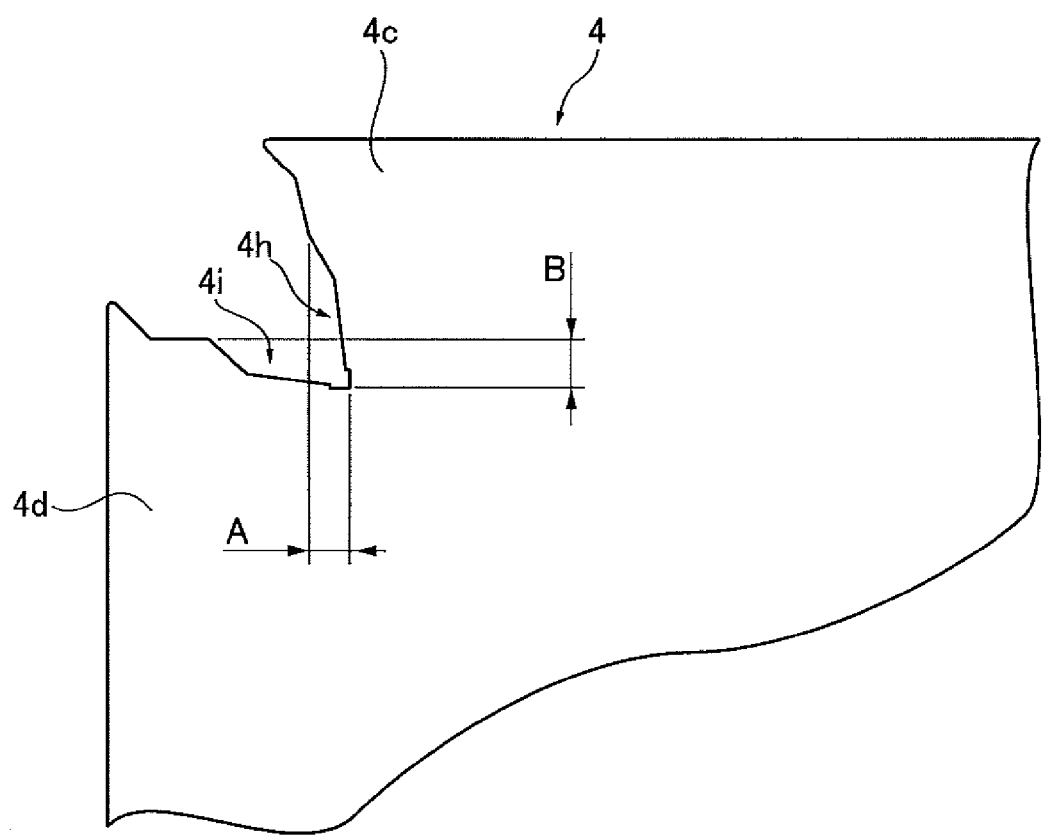
FIG. 7 is a development view illustrating each engagement protrusion before a bending process.

FIG. 7 is a development view illustrating each engagement protrusion before a bending process. FIG. 7 illustrates the shapes before bending the leading end corner portions 4h, 4i of the adjacent engagement protrusions 4c, 4d in the upper left corner portion.

Before the bending process of the upper left corner portion illustrated in FIG. 7, the measurement A on the side of the leading end corner portion 4h is set shorter than the measurement B on the side of the leading end corner portion 4i (B>A). Thereby, as illustrated in FIG. 6B, in the upper left corner portion after the bending process, the leading end corner portion 4h is formed to be shorter than the leading end corner portion 4i, so that the corners of the leading end corner portions 4h, 4i do not interfere (make contact) with each other.

In addition, before the bending process of the lower left corner portion, the measurement B on the leading end corner portion 4i side is set to be shorter than the measurement A on the leading end corner portion 4h side (A>B). In the lower left corner portion after the bending process, the leading end corner portion 4i is thereby formed to be shorter than the leading end corner portion 4h, so that the corners of the leading end corner portions 4h, 4i do not interfere (make contact) with each other.

Figure 8A:
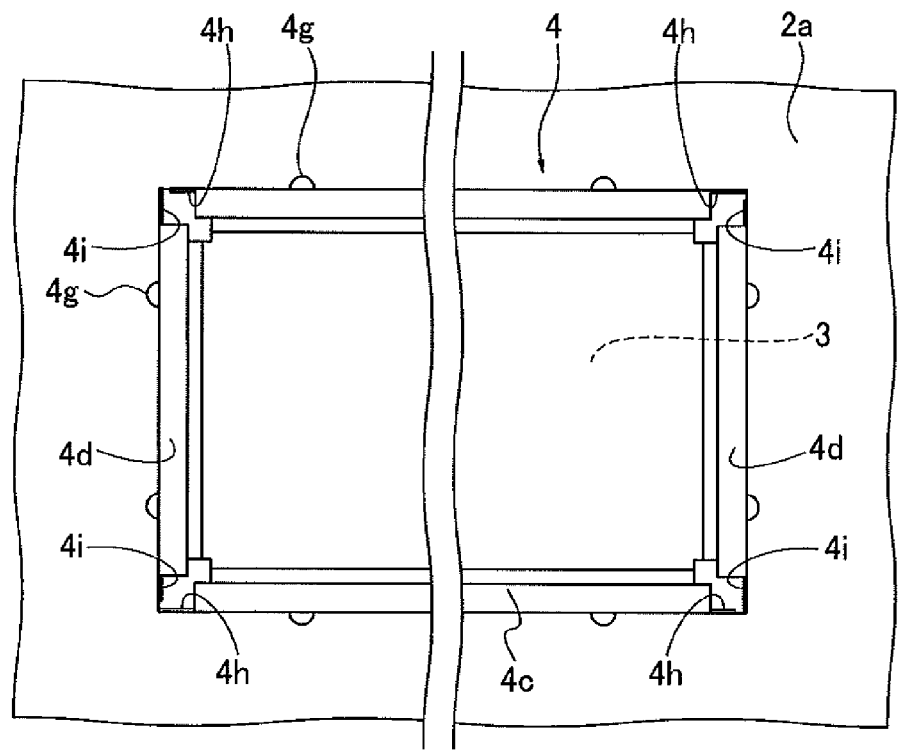
FIG. 8A is a view illustrating a state in which each engagement protrusion of the I/O panel in Embodiment 1 is fixed to the panel fixing opening.
Figure 8B:
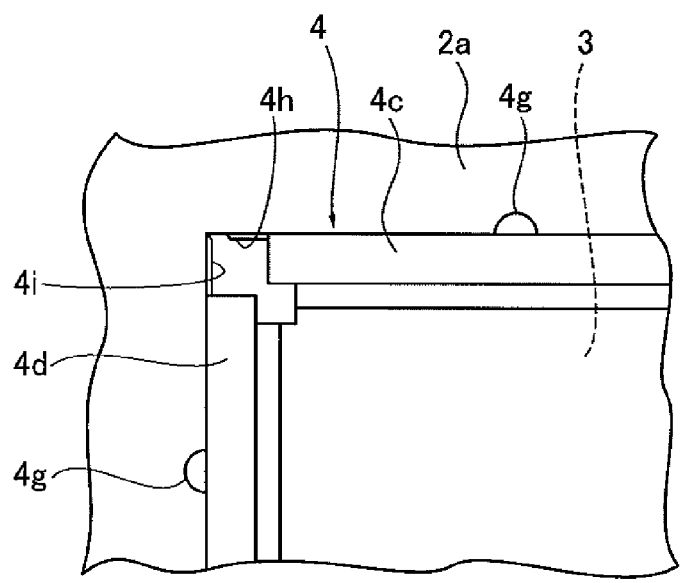
FIG. 8B is an enlarged view illustrating the neighborhood of the leading end corner portions of the upper left side fixed to the panel fixing opening.

Accordingly, as illustrated in FIGS. 8A, 8B, if the engagement protrusions 4c, 4d of the I/O panel 4 are inserted into the opening 3 while bending in the inside direction of the opening 3, and are engaged with the opening 3, as described above, a space is formed on the side of one leading end corner portion 4h, 4i, which is formed to be shorter than the other and is engaged with each inside wall surface of the four corner portions of the opening 3. In FIG. 8A, the connector opening of the panel surface 4b is omitted. FIG. 8B illustrates the leading end corner portions 4h, 4i engaged with the corner portions of the inside wall surfaces in the upper left portion of the opening 3.

Therefore, when inserting each of the engagement protrusions 4c, 4d into the opening 3, the projection 4g makes contacts with the inside wall surface 3a, and each engagement protrusion 4c, 4d bends in the inside direction of the opening 3. In this case, since one leading end corner portion 4h, 4i is formed to be shorter than the other such that the leading end corner portions 4h, 4i of the engagement protrusions 4c, 4d become asymmetric with respect to the intermediate line A in the middle of the corner portions if the leading end corner portions 4h, 4i of the engagement protrusions 4c, 4d, bend at the maximum amount (refer to FIG. 6A), the corners of the leading end corner portions 4h, 4i do not interfere (make contact) with each other.

For this reason, even if the leading end corner portions 4h, 4i of the engagement protrusions 4c, 4d of the I/O panel 4 have measurement errors in manufacturing, the corners of the leading end corner portions 4h, 4i stably make contact without interfering with each other when the engagement protrusions 4c, 4d are inserted into the opening 3 while bending, and are fixed to the opening 3. The engagement protrusions 4c, 4d can be thereby inserted into predetermined positions of the opening 3, so that the I/O panel 4 can be effectively fixed to the opening 3.

In this embodiment, one leading end corner portion 4h, 4i of the adjacent engagement protrusions 4c, 4d in the four corner portions of the I/O panel 4 is set shorter than the other, so that the leading end corner portions 4h, 4i are formed to be asymmetric with respect to the intermediate line A in the middle of the corner portions. However, one leading end corner portion 4h, 4i of the adjacent engagement protrusions 4c, 4d can be set shorter than the other in the selected two corner portions or the selected three corner portions of the four corner portions of the I/O panel 4, such that the leading end corner portions 4h, 4i become asymmetric with respect to the intermediate line A in the middle of the corner portions.

In this case, even if the leading end corner portions 4h, 4i of the engagement protrusions 4c, 4d of the I/O panel 4 have measurement errors in manufacturing, the ends of the leading end corner portions 4h, 4i stably make contact without interfering with each other when the engagement protrusions 4c, 4d are inserted into the opening 3 while bending to be engaged therewith.

Embodiment 2

In this embodiment, a panel fixing structure when the size of the opening to which the I/O panel is fixed is large will be described. In addition, since the same reference numbers are applied to the members which are the same as the members in Embodiment 1, the duplicated description will be omitted.

Figure 9A:
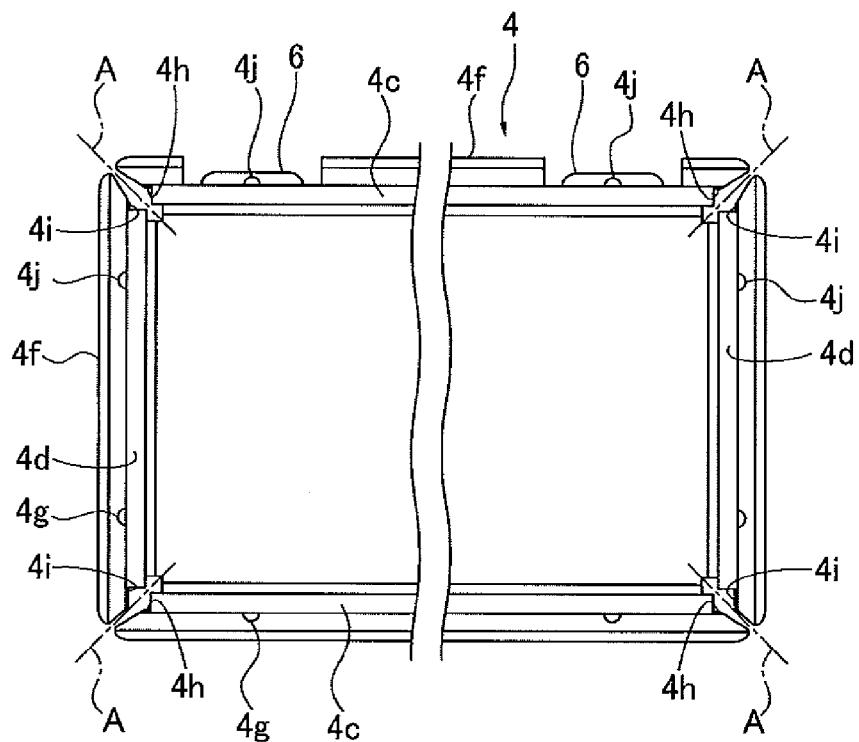
FIG. 9A is a view illustrating the neighborhood of the leading end corner portion of each engagement protrusion of the I/O panel in Embodiment 2.

FIG. 9A is a schematic plan view illustrating the engagement protrusions 4c, 4d of the I/O panel 4 in the present embodiment. In FIG. 9A, the connector opening of the panel surface 4b is omitted.

As illustrated in FIG. 9A, in this embodiment, in the corner portions of the upper right and left portions of the I/O panel 4, the leading end corner portions 4h, 4i of the engagement protrusions 4c, 4d are formed to be short having the same measurement, so as to be symmetric to the intermediate line A in the middle of the corner portions. Accordingly, the maximum bending amount of the leading end corner portions 4h, 4i in the corner portions of the upper right and left portions is set to be the same as the intermediate line A in the middle the corner portions. Therefore, the bending amount by the leading end corner portions 4h, 4i in the corner portions of the upper right and left portions is largely set, so that the engagement protrusions 4c, 4d can be easily inserted into the opening 3.

In the corner portions of the lower right and left portions of the I/O panel 4, the leading end corner portion 4h of the engagement protrusion 4c is formed shorter than the leading end corner portion 4i of the engagement protrusion 4d, and the leading end corner portions 4h, 4i are set to be asymmetric to the intermediate line A in the middle of the corner portions. Accordingly, in the corner portions of the lower right and left portions of the I/O panel 4, the maximum bending amount of the leading end corner portions 4h, 4i is set to be different to the intermediate line A in the middle of the corner portions.

Figure 9B:
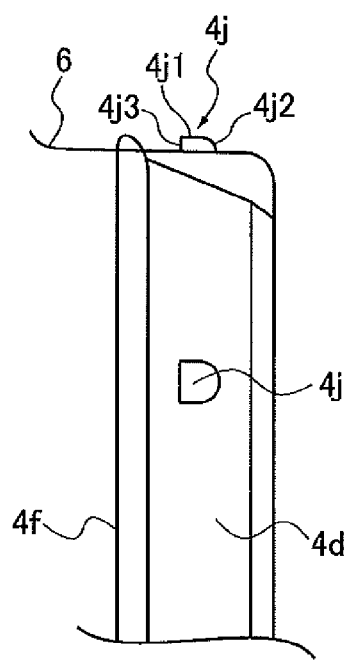
FIG. 9B is a side view illustrating the neighborhood of the upper side corner portion of the engagement protrusion.

In this embodiment, as illustrated in FIGS. 9A, 9B, the locking projection 4j is provided near the corner portion of each of the adjacent engagement protrusions 4c, 4d in the upper right and left portions. A plurality of semispherical projections 4g is provided in predetermined positions of each of the engagement protrusions 4c, 4d.

Figure 10A:
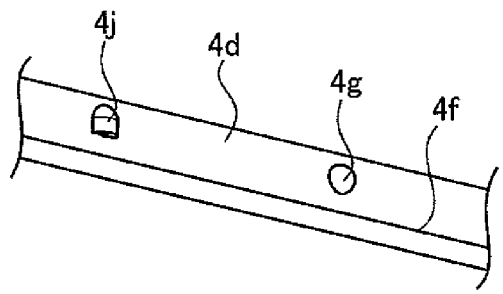
FIG. 10A is a perspective view illustrating a projection and a locking projection provided in the engagement protrusion in Embodiment 2.
Figure 10B:
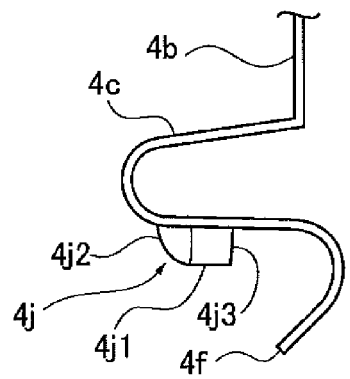
FIG. 10B is an enlarged view illustrating the locking projection.
Figure 10C:
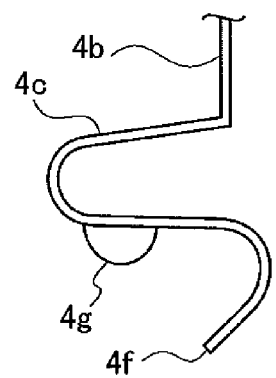
FIG. 10C is an enlarged view illustrating the projection.

As illustrated in FIGS. 9B, 10A, 10B, the locking projection 4j has a shape in which a ¼ semispherical portion 4j2 which is ½ of the semispherical portion is integrally formed in the one end of a semicylindrical portion 4j1. A semicircular end surface 4j3 of the semicylindrical portion 4j1 of the locking projection 4j faces the leading end locking portion 4f. The projection 4g has a semispherical form as illustrated in FIGS. 10A, 10C. In addition, in terms of the shape of the locking projection 4j, only the ¼ semispherical portion 4j2 can be used without using the semicylindrical portion 4j1. In this case, the end surface of the ¼ semispherical portion 4j2 becomes the semicircular end surface 4j3.

Figure 11:
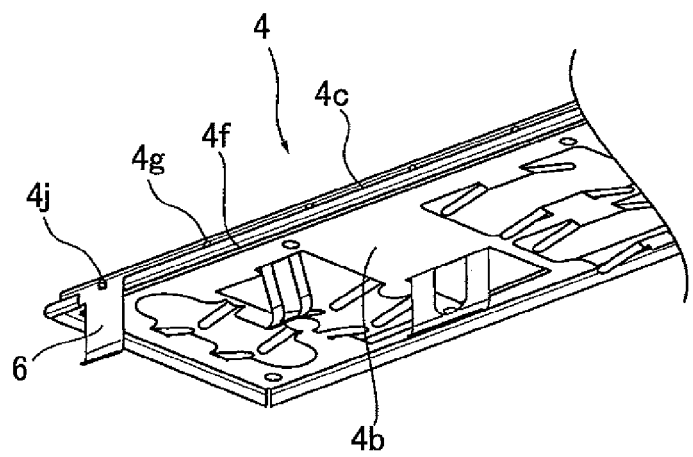
FIG. 11 is a perspective view illustrating the neighborhood of a handle provided in the neighborhood of the corner portion of the engagement protrusion of the I/O panel in Embodiment 2.

In this embodiment, as illustrated in FIGS. 9A, 9B, 11, a handle 6 is provided near the corner portions of both sides where the locking projection 4j of the engagement protrusion 4c on one side (upper left portion in FIG. 11) is provided. The handle 6 is located on the I/O panel insertion side.

Figure 12:
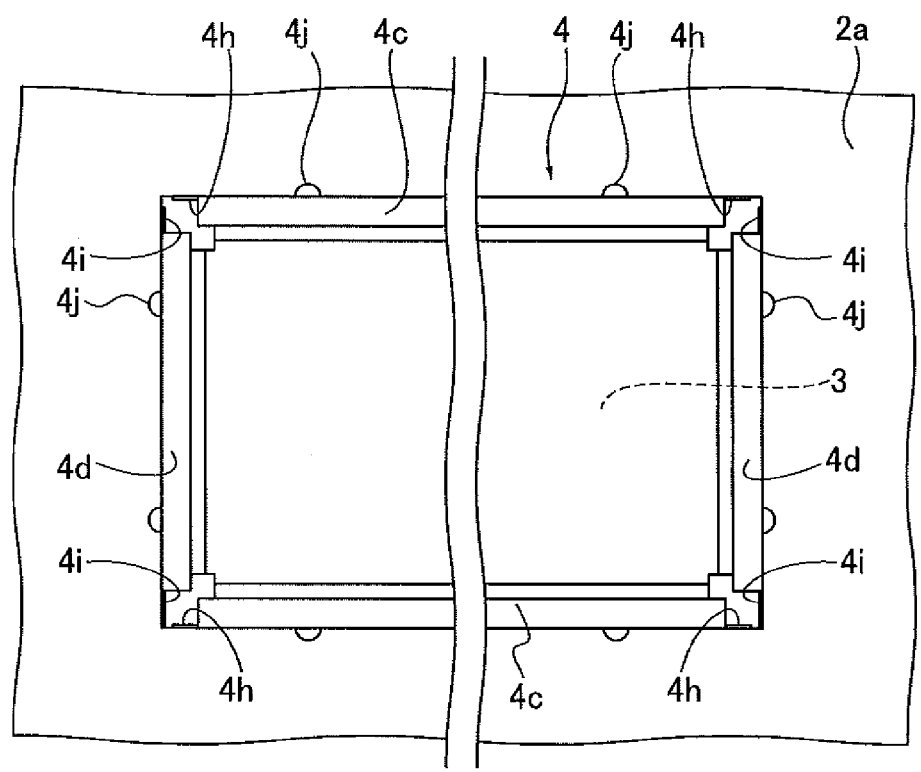
FIG. 12 is a view illustrating a state in which each engagement protrusion of the I/O panel in Embodiment 2 is fixed to the panel fixing opening.

As illustrated in FIG. 12, if the engagement protrusions 4c, 4d of the I/O panel 4 are inserted into the opening 3 similar to Embodiment 1, the semispherical projection 4g and the ¼ semispherical portion 4j2 of the locking projection 4j (refer to FIGS. 10B, 10C) makes contact with the inside wall surface of the opening 3, so that the engagement protrusions 4c, 4d bend in the inside direction of the opening 3. Then, if the projection 4g and the semicircular end surface 4j3 of the locking projection 4j are inserted into the opposite edge portion of the opening 3, the bent engagement protrusions 4c, 4d are brought back to the original condition, and are engaged with the inside wall surface of the opening 3, and then, the leading end locking portion 4f is locked to the housing back surface 2a.

Figure 13A:
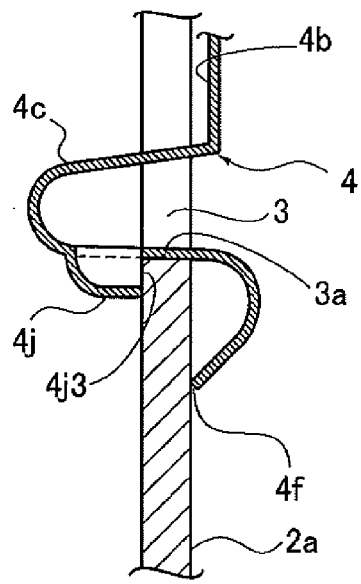
FIG. 13A is a view illustrating a state in which both surfaces near the edge portions of the panel fixing opening are sandwiched by the leading end locking portion and the locking projection provided in each of the engagement protrusions of the I/O panel in Embodiment 2.
Figure 13B:
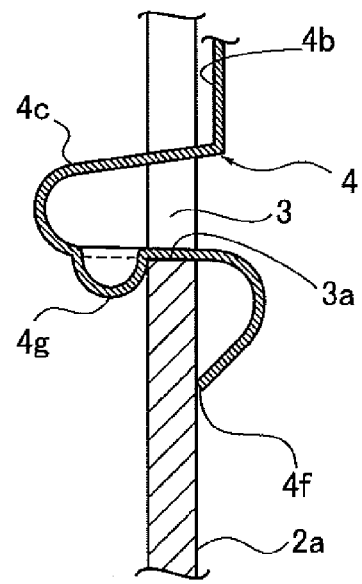
FIG. 13B is a view illustrating a state in which both surfaces near the edge portions of the panel fixing opening are sandwiched by the leading end locking portion and the projection provided in the engagement protrusion of the I/O panel.

Accordingly, as illustrated in FIG. 13A, both surfaces near the edge portions of the opening 3 are sandwiched between the leading end locking portion 4f and the semicircular end surface 4j3 of the locking projection 4j near the corner portions of the adjacent engagement protrusions 4c, 4d in the upper right and left portions, and both surfaces near the edge portions of the opening 3 are sandwiched between the edge portion of the projection 4g and the leading end locking portion 4f as illustrated in FIG. 13B in another area of the engagement protrusions 4c, 4d. The I/O panel 4 is thereby fixed to the opening 3.

As illustrated in FIG. 9A, if the space between the leading end corner portions 4h, 4i provided in the corner portions of the adjacent engagement protrusions 4c, 4d in the upper right and left portions is set larger, the leading end corner portions 4h, 4i of the adjacent engagement protrusions 4c, 4d in the upper right and left portions easily bend in the inside direction of the panel fixing opening 3.

Figure 14A:
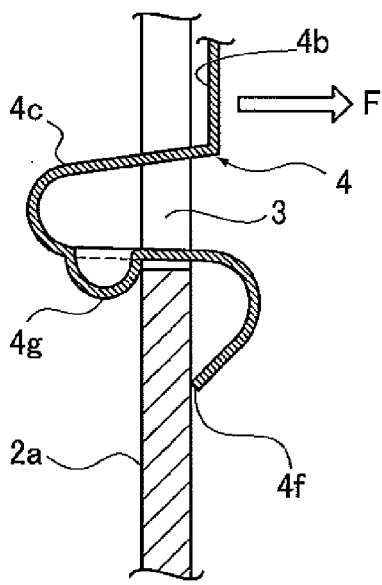
FIG. 14A is a view illustrating a state in which external force acts on the locked I/O panel in which both surfaces near the edge portions of the panel fixing opening are sandwiched by the leading end locking portion and the projection of the engagement protrusion.

For this reason, if the semispherical projection 4g is provided near the corner portions of the adjacent engagement protrusions 4c, 4d in upper right and left portions, as illustrated in FIG. 14A, when the external force F acts on the I/O panel 4 fixed to the opening 3 in the removing direction, the locking state of the semispherical projection 4g and the opening 3 is easily released by the bending of the engagement protrusion 4c in the inside direction of the opening 3 because the contact surface between the edge portion of the semispherical projection 4g and the neighborhood of the edge portion of the opening 3 is small.

However, in the present embodiment, the locking projection 4j is provided near the corner portion of the adjacent engagement protrusions 4c, 4d in the upper right and left portions, and the semicircular end surface 4j3 of the locking projection 4j is locked near the edge portion of the opening 3 (refer to FIG. 13A), so that the area of the contact surface between the semicircular end surface 4j3 of the locking projection 4j and the neighborhood of the opening 3 is increased.

Figure 14B:
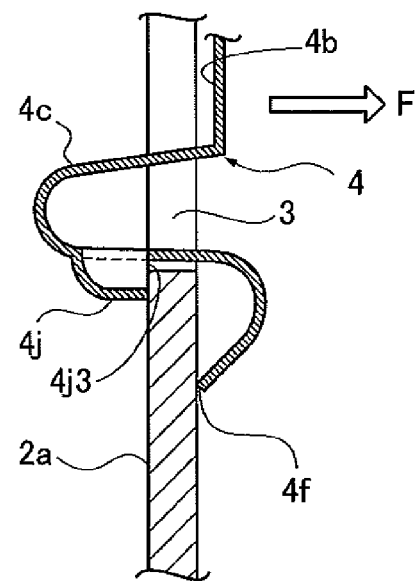
FIG. 14B is a view illustrating a state in which an external force acts on the locked I/O panel in which both surfaces near the edge portions of the panel fixing opening are sandwiched by the leading end locking portion and the locking projection of the engagement protrusion.

Since the contact surface between the semicircular end surface 4j3 of the locking projection 4j and the neighborhood of the end portion of the opening 3 is large, the locking state between the locking projection 4j and the opening 3 is hardly released even if the size of the opening 3 to which the I/O panel 4 is fixed is large, as illustrated in FIG. 14B, and some kind of external force F acts on the I/O panel 4 fixed to the opening 3 in the removing direction. Accordingly, even if some kind of external force F acts on the I/O panel 4 fixed to the opening 3, the I/O panel 4 is prevented from being removed from the opening 3.

Meanwhile, when intentionally removing the I/O panel 4 from the opening 3, the I/O panel 4 can not be easily removed because the contact surface between the semicircular end surface 4j3 of the locking projection 4j and the neighborhood of the edge portion of the opening 3 is large. Consequently, in the present embodiment, as illustrated in FIGS. 9A, 9B, 11, the handle 6 is attached to the neighborhood of the corner portion where the locking projection 4j of the locking protrusion 4c on the upper side is located.

Figures 15A, 15B:
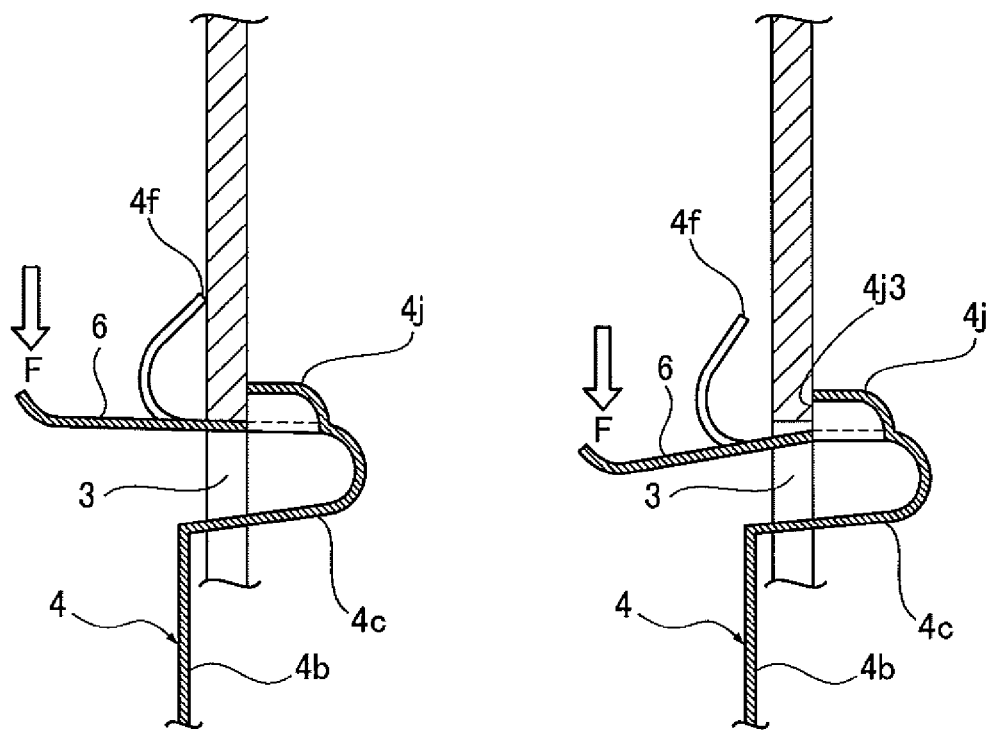
FIGS. 15A, 15B are views each illustrating a state in which the I/O panel is removed from the panel fixing opening by a force acting on the handle provided in the I/O panel in Embodiment 2.

When intentionally removing the I/O panel 4 from the opening 3, as illustrated in FIG. 15A, the handle 6 is pressed down by the force F acting in the inside direction (lower direction in FIG. 15A) of the opening 3 from the upper side of the handle 6. Thereby, as illustrated in FIG. 15B, the engagement protrusion 4c bends in the inside direction of the opening 3 by the pressing down of the handle 6, so that the locking state between the semicircular end surface 4j3 of the locking projection 4j and the neighborhood of the edge portion of the opening 3 is released, and the I/O panel 4 can be easily removed from the opening 3.

Embodiment 3

Figure 16:
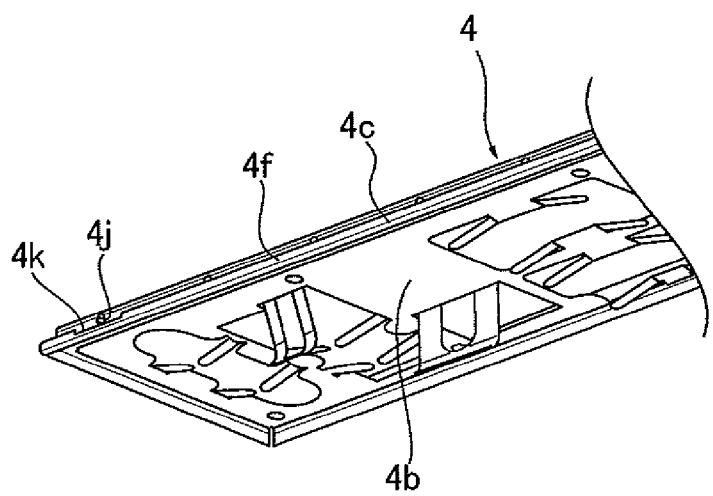
FIG. 16 is a perspective view illustrating the neighborhood of a tool insertion groove provided near the corner portion of the engagement protrusion of the I/O panel in Embodiment 3.

In Embodiment 2, the handle 6 is provided near the corner portion where each locking projection 4j of the upper side engagement protrusion 4c is located. However, in this embodiment, as illustrated in FIG. 16, a tool insertion groove 4k is formed near the corner portions of both sides where the locking projection 4j of the upper side engagement protrusion 4c of the I/O panel 4 is located, such that the tool insertion groove 4k is located on the I/O panel insertion side.

Figure 17:
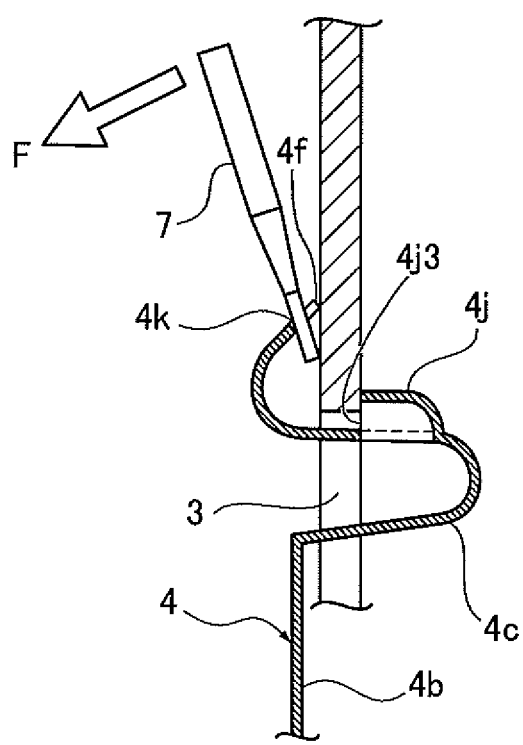
FIG. 17 is a view illustrating a state in which the I/O panel is removed from the panel fixing opening by a force acting on the tool inserted into the tool insertion groove provided in the I/O panel in Embodiment 3.

When intentionally removing the I/O panel 4 from the opening 3, as illustrated in FIG. 17, an industrial tool (negative driver or the like) 7 is inserted into the tool insertion groove 4k.

By moving the tool 7 in the arrow F direction with the surface near the edge portion of the opening 3 with which the leading end of the tool 7 contact as the supporting point, the engagement protrusion 4c bends in the inside direction of the opening 3, so that the locking state between the semicircular end surface 4j3 of the locking projection 4j and the neighborhood of the edge portion of the opening 3 is released, and thus, the I/O panel 4 can be easily removed from the opening 3.

Embodiment 4

Figure 18A:
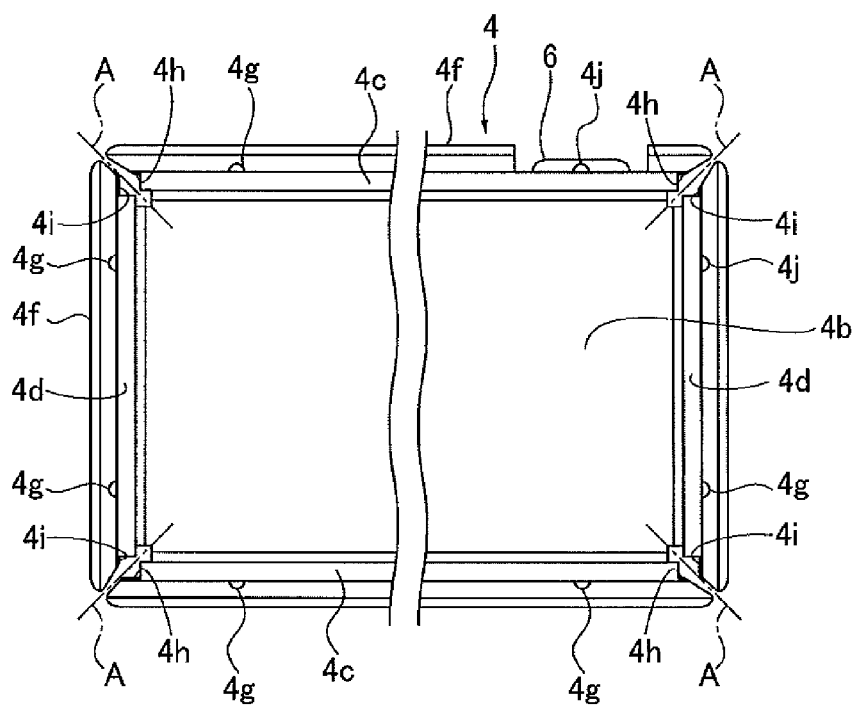
FIG. 18A is a view illustrating the neighborhood of the leading end corner portion of each engagement protrusion of the I/O panel in Embodiment 4.

FIG. 18A is a schematic plan view illustrating the engagement protrusions 4c, 4d of the I/O panel 4 in this embodiment. In FIG. 18A, the connector opening of the panel surface 4b is omitted.

As illustrated in FIG. 18A, in this embodiment, the leading end corner portions 4h, 4i of the engagement protrusions 4c, 4d are formed to be short having the same measurement in the corner portions of the upper right portion of the I/O panel 4, and are set to be symmetric to the intermediate line A in the middle of the corner portions. Therefore, in the corner portions of the upper right portion, the maximum bending amount of the leading end corner portions 4h, 4i is set to be the same with respect to the intermediate line A in the middle of the corner portions. Accordingly, the bending amount by the leading end corner portions 4h, 4i in the corner portions of the upper right portion can be set larger, so that the engagement protrusions 4c, 4d can be easily inserted into the panel fixing opening 3.

In the corner portions of the upper left and lower right portions of the I/O panel 4, the leading end corner portion 4h of the engagement protrusion 4c is set shorter than the leading end corner portion 4i of the engagement protrusion 4d, and the leading end corner portions 4h, 4i are set to be asymmetric with respect to the intermediate line A in the middle of the corner portions. Accordingly, in the corner portions of the upper left and lower right portions, the maximum bending amount of the leading end corner portions 4h, 4i is set to be different to the intermediate line A in the middle of the corner portions.

In the corner portions of the lower left portion of the I/O panel 4, the leading end corner portion 4i of the engagement protrusion 4d is set shorter than the leading end corner portion 4h of the engagement protrusion 4c, and the leading end corner portions 4h, 4i are set to be symmetric to the intermediate line A in the middle of the corner portions. Accordingly, in the corner portions of the lower left portion, the maximum bending amount of the leading end corner portions 4h, 4i is set to be different to the intermediate line A in the middle of the corner portions.

Moreover, in the present embodiment, as illustrated in FIG. 18A, the locking projection 4j (refer to FIGS. 9B, 10A) is provided near the corner portions of the adjacent engagement protrusions 4c, 4d in the upper right portion. A plurality of semispherical projections 4g (refer to FIG. 10A) is also provided near another corner portions of the engagement protrusions 4c, 4d.

As illustrated in FIG. 18A, the handle 6 is provided near the corner portion where the locking projection 4j of the upper side locking protrusion 4c is provided such that the handle 6 is located on the I/O panel insertion side.

Figure 18B:
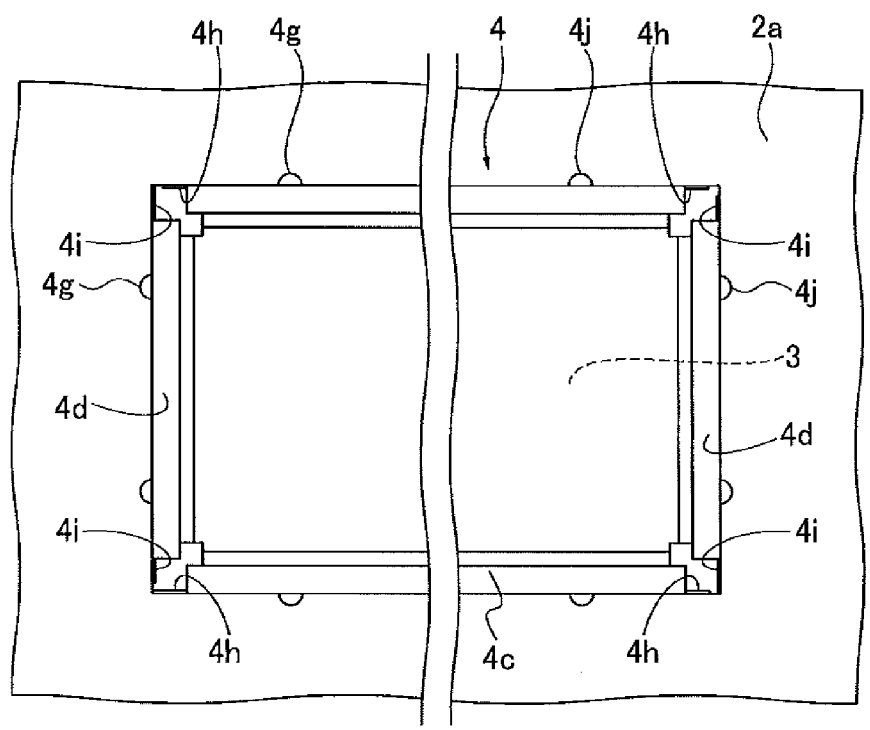
FIG. 18B is a view illustrating a state in which each engagement protrusion of the I/O panel in Embodiment 4 is fixed to the panel fixing opening.
Figure 19:
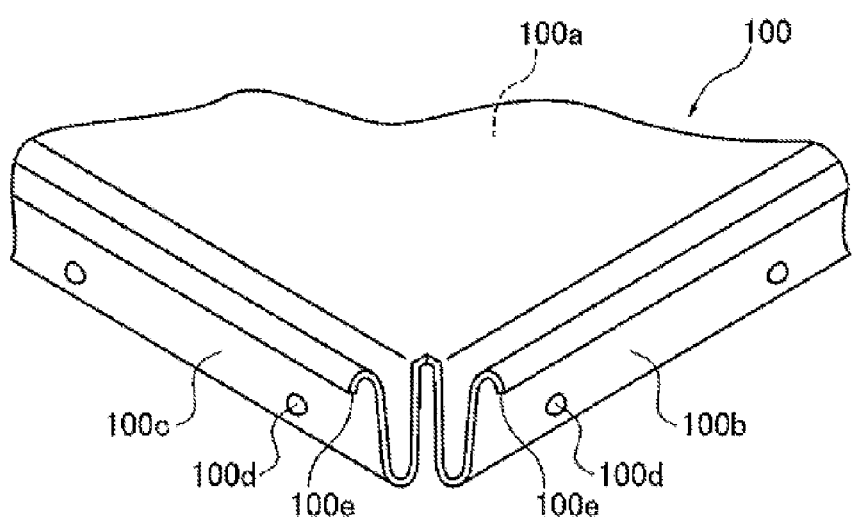
FIG. 19 is a perspective view illustrating the neighborhood of the corner portion of a conventional I/O panel.
Figure 20A:
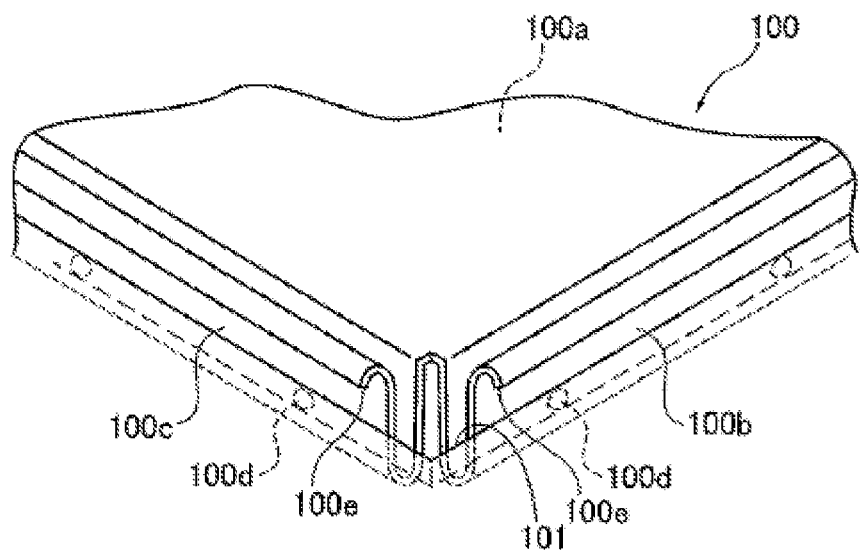
FIG. 20A is a view illustrating a state while inserting the conventional I/O panel into the panel fixing opening.
Figure 20B:
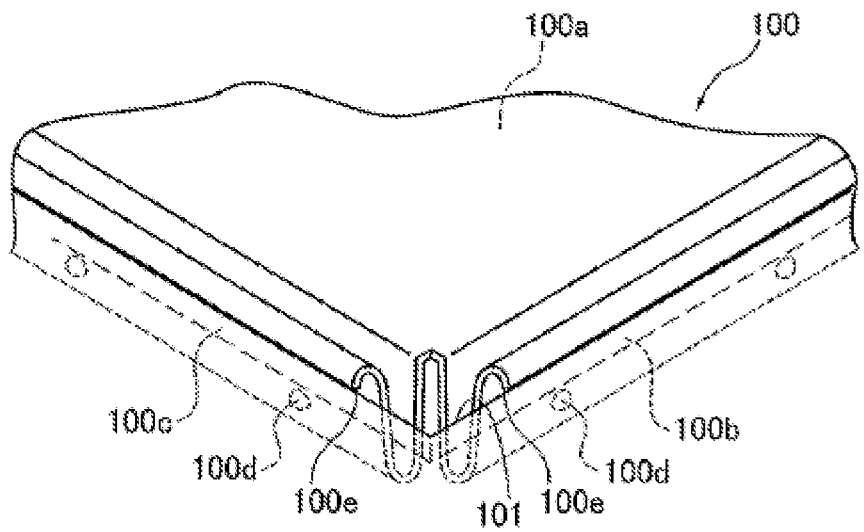
FIG. 20B is a view illustrating a state after inserting the I/O panel into the panel fixing opening.
Figure 21A:
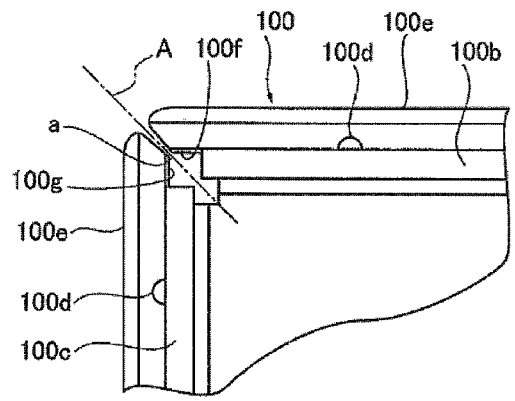
FIG. 21A is a view illustrating the neighborhood of the leading end corner portion of the adjacent engagement protrusions in the conventional I/O panel.
Figure 21B:
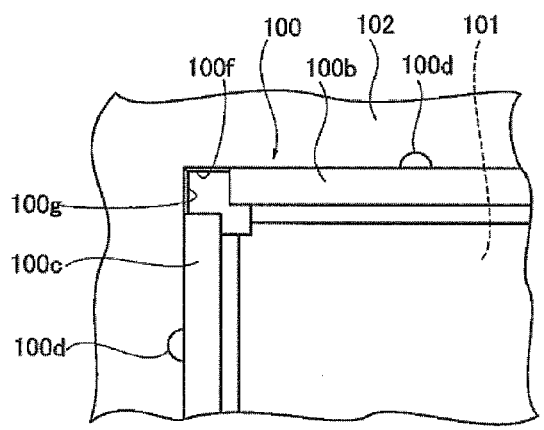
FIG. 21B is an enlarged view illustrating the neighborhood of the leading end corner portion of the upper left fixed to the panel fixing opening.

As illustrated in FIG. 18B, if the engagement protrusions 4c, 4d of the I/O panel 4 are inserted into the opening 3 similar to Embodiment 1, the engagement protrusions 4c, 4d which are bent in the insertion are brought back to the original condition, and are engaged with the inner wall surface of the opening 3, and then, the leading end locking portion 4f is locked to the housing back face 2a.

Accordingly, both surfaces near the edge portions of the opening 3 are sandwiched between the leading end locking portion 4f and the semicircular end surface 4j3 of the locking projection 4j near the corner portion of the adjacent engagement protrusions 4c, 4d on the upper right side, as illustrated in FIG. 13A. Both surfaces near the edge portions of the opening 3 are also sandwiched between the leading end locking portion 4f and the edge portion of the projection 4g near another corner portion of the adjacent engagement protrusions 4c, 4d as illustrated in FIG. 13B. Thus, the I/O panel 4 is fixed to the opening 3.

When intentionally removing the I/O panel 4 from the opening 3, similar to the above, the handle 6 is pressed down by the force acting on the handle 6 provided near the locking projection 4j of the upper side engagement protrusion 4c from the upper side. The locking state between the semicircular end surface 4j3 of the locking projection 4j and the neighborhood of the edge portion of the opening 3 is thereby released, thus, the I/O panel 4 can be easily removed from the opening 3.

In addition, the metal I/O panel 4 is used in each of the embodiments, but the I/O panel can be made of resin. In this case, a conductive process is applied to at least one surface of the I/O panel.

According to one embodiment of the present invention, since at least one corner portion has a large maximum bending amount of the end portions of the adjacent engagement protrusions in the four corner portions, the engagement protrusions can be effectively inserted into a predetermined position of the opening, and the engagement protrusions can be prevented from being removed from the opening.

According to one embodiment of the present invention, the stable contact state of the corners of the end portions of the engagement corner portions of the adjacent engagement protrusions can be obtained without interfering with each other when the engagement protrusions are inserted into the opening to be engaged therewith even if the end portion of each of the engagement protrusions of the panel has a measurement error in manufacturing.

According to one embodiment of the present invention, since the ¼ semispherical portion is disposed in the projection provided near the corner portion having a large bending amount, and the semicircular bottom surface on the side opposite the ¼ semispherical portion faces the leading end locking portion side, the panel can be securely fixed to the opening. Therefore, even if the end portion of the engagement protrusion is bent by the external force in the direction opposite the panel insertion direction, the engagement protrusions can be prevented from being removed from the opening because the semicircular bottom surface of the projection on the corner portion side makes contact with the edge portion of the opening.

According to one embodiment of the present invention, since the panel is fixed to the opening by sandwiching the edge portions of the opening by the projection and the leading end locking portion from both surfaces, the panel can be effectively fixed to the opening.

According to one embodiment of the present invention, when intentionally removing the panel from the opening, the end portion of the engagement protrusion is bent in the inside direction of the opening by the force acting on the handle. The engagement protrusion can be thereby easily removed from the opening.

According to one embodiment of the present invention, when intentionally removing the panel from the opening, a tool is inserted into the tool insertion groove, and the end portion of the engagement protrusion is bent in the inside direction of the opening by the force acting on the tool with the surface near the edge portion of the opening with which the leading end of the tool has contact as a supporting point. The engagement protrusion can be thereby easily removed from the opening.

Although the embodiments of the present invention have been described below, the present invention is not limited thereto. It should be appreciated that variations may be made in the embodiments described by persons skilled in the art without departing from the scope of the present invention.

What is claimed is:

1. A panel fixing structure, which removably fixes a panel to a rectangular opening provided in a housing, so as to cover a circumference of one or a plurality of interface terminal portions provided inside the housing, the panel comprising:
   a panel surface comprising four corner portions and having a connector opening in accordance with a shape and a position of the interface terminal portion; and
   four engagement protrusions each having a spring property, each engagement protrusion of the four engagement protrusions protruding in an insertion direction of the opening along an edge portion of each of four sides of the panel surface, the four engagement protrusions being formed to have a space between adjacent leading end corner portions in each of the four corner portions of the panel surface,
   said each engagement protrusion of the four engagement protrusions having a first wall portion which extends from each of four edge portions of the panel surface in the insertion direction of the opening, a second wall portion in which a leading end portion of the first wall portion is bent outside and which extends in the direction opposite the insertion direction of the opening, and a plurality of projections provided in an outer surface of the second wall portion along the longitudinal direction of the second wall portion, wherein
   if said each engagement protrusion of the four engagement protrusions of the panel is inserted into the opening, the projections make contact with the inside wall surface of the opening, and if said each engagement protrusion of the four engagement protrusions reaches an end portion opposite the insertion direction of the opening while bending in the inside direction of the opening, the engagement protrusion which was bent is brought back to an original condition, so that the projections are locked near the edge portion opposite the panel insertion side of the opening, and the panel is thereby fixed to the opening, and
   in each corner portion of the four corner portions of the panel surface, lengths of the adjacent leading end corner portions are different to each other such that distances from an intermediate line in a middle of the corner portion of the panel surface to the adjacent leading end corner portions are different to each other so as to prevent interference by one of the adjacent leading end corner portions with the other of the adjacent leading end corner portions, when bending each of the four engagement protrusions.

2. The panel fixing structure according to claim 1, wherein the projection includes a semispherical portion and a ¼ semispherical portion in which the semispherical portion is cut to about half, and a cut surface is set to a direction which locks to the edge portion on the opposite side of the opening when the panel is inserted, and
   the ¼ semispherical portion is provided near the corner portion having the large bending amount, and the semispherical portion is provided near the corner portion having the small bending amount.

3. The panel fixing structure according to claim 1, wherein a leading end locking portion is formed in a leading end portion of the second wall portion, and
   in a position where said each engagement protrusion of the panel is inserted into the opening, and the projection is located near an edge portion of the opening on the side opposite the panel insertion side, the leading end locking portion is locked near an edge portion of the opening on the panel insertion side, and the edge portion of the opening is sandwiched from both sides by the projection and the leading end locking portion, so that the panel is fixed to the opening.

4. The panel fixing structure according to claim 1, wherein a handle configured to bend an engagement protrusion in the inside direction of the opening so as to locate the engagement protrusion in the panel insertion side of the opening is provided near the projection provided in the end portion of the engagement protrusion.

5. The panel fixing structure according to claim 1, wherein a tool insertion groove into which a tool for bending an engagement protrusion in the inside direction of the opening is provided near the projection provided in the end portion of the engagement protrusion.

6. An information processor having the housing to which the panel fixing structure according to claim 1 is applied to removably fix the panel to the rectangular opening provided in the housing, so as to cover the circumference of the interface terminal portions provided inside the housing.

* * * * *